(12) United States Patent
Ren et al.

(10) Patent No.: US 12,484,332 B2
(45) Date of Patent: Nov. 25, 2025

(54) SOLAR CELL AND PREPARATION METHOD THEREOF

(71) Applicant: HENGDIAN GROUP DMEGC MAGNETICS CO., LTD., Jinhua (CN)

(72) Inventors: Yong Ren, Jinhua (CN); Chaoyan Fang, Jinhua (CN); Deshuang Chen, Jinhua (CN)

(73) Assignee: HENGDIAN GROUP DMEGC MAGNETICS CO., LTD., Jinhua (CN)

( * ) Notice: Subject to any disclaimer, the term of this patent is extended or adjusted under 35 U.S.C. 154(b) by 100 days.

(21) Appl. No.: 18/509,324

(22) Filed: Nov. 15, 2023

(65) Prior Publication Data

US 2025/0056900 A1 Feb. 13, 2025

Related U.S. Application Data

(63) Continuation of application No. PCT/CN2023/116688, filed on Sep. 4, 2023.

(30) Foreign Application Priority Data

Aug. 10, 2023 (CN) .......................... 202311007485.2

(51) Int. Cl.
*H10F 71/10* (2025.01)
*H10F 71/00* (2025.01)

(52) U.S. Cl.
CPC ....... *H10F 71/103* (2025.01); *H10F 71/1221* (2025.01); *H10F 71/128* (2025.01)

(58) Field of Classification Search
None
See application file for complete search history.

(56) References Cited

FOREIGN PATENT DOCUMENTS

| CN | 109216498 A | 1/2019 |
|---|---|---|
| CN | 112331742 A | 2/2021 |
| CN | 113363350 A | 9/2021 |
| CN | 113808927 A | 12/2021 |
| CN | 113972302 A | 1/2022 |
| CN | 115101621 A | 9/2022 |
| CN | 115332392 A | 11/2022 |
| CN | 115498057 A | 12/2022 |
| CN | 116314471 A | 6/2023 |
| CN | 116435385 A | 7/2023 |
| JP | A 2009021494 | 1/2009 |

(Continued)

OTHER PUBLICATIONS

English language machine translation of Lin (CN 115498057 A). (Year: 2025).*

(Continued)

*Primary Examiner* — Eli S Mekhlin (57) ABSTRACT

A solar cell and a preparation method thereof are provided. A method for preparing the solar cell includes following steps: forming an amorphous silicon layer on a tunneling oxide layer at a first side; forming a doped polycrystalline silicon layer in a first process by a diffusion doping treatment; forming a doped oxide layer on the doped polycrystalline silicon layer in a second process; and after the doped oxide layer is formed, doping the first side selectively and heavily by a laser doping process, and forming a selective emitter region in a heavily doped region.

8 Claims, 2 Drawing Sheets

(56) References Cited

FOREIGN PATENT DOCUMENTS

| | | |
|---|---|---|
| JP | 2016051767 A | 4/2016 |
| JP | A 2016046304 | 4/2016 |
| WO | WO2017018300 A1 | 2/2017 |
| WO | WO2023072013 A1 | 5/2023 |

OTHER PUBLICATIONS

International Search Report of PCT/CN2023/116688, Dec. 2, 2024.
Notice of Reasons for Refusal of JP2024115714, Aug. 20, 2024.
European search report of EP23800298.4, Dec. 17, 2024.
Second Notice of Reasons for Refusal of JP2024-115714, Dec. 24, 2024.

\* cited by examiner

SOLAR CELL AND PREPARATION METHOD THEREOF

CROSS-REFERENCE TO RELATED APPLICATIONS

This application is a continuation of international patent application No. PCT/CN2023/116688, filed on Sep. 4, 2023, which itself claims priority to Chinese patent application No. 202311007485.2, filed on Aug. 10, 2023, and titled "SOLAR CELL AND PREPARATION METHOD THEREOF". The content of the above identified application is hereby incorporated herein in their entireties by reference.

TECHNICAL FIELD

The present disclosure relates to a field of a photovoltaic, and in particular, to a solar cell and a preparation method thereof.

BACKGROUND

In the photovoltaic field, a front side of a TOPCon (Tunnel Oxide Passivated Contact) cell is similar to a conventional PERC (Passivated Emitter and Rear Cell). TOPCon cell is characterized by a layer of a tunneling oxide layer on a back side thereof and a layer of a doped polycrystalline silicon layer on the tunneling oxide layer, which together form a passivation contact structure, and providing good interface passivation for a back side of a silicon wafer.

SE (Selective Emitter) process is a selective emitter technology, which is a method of high concentration doping (heavy doping) at a contact position between a gate line and a silicon wafer, and low concentration doping (light doping) at the area outside an electrode. On the one hand, the selective emitter technology can reduce a contact resistance between the silicon wafer and the gate line and a series resistance of a cell; on the other hand, a low-concentration doped region can reduce a surface recombination and improve a lifetime of minority carrier, thus improving a short-circuit current and an open-circuit voltage of the cell.

In the related art, a first silicon layer with light doping is deposited first, then a second silicon layer with heavy doping is deposited on the first silicon layer, and then a part of the second silicon layer in a non-metallized pattern area is removed according to a metallization pattern. Because the second silicon layer and the first silicon layer are both silicon, the difference between them is only a doping concentration. No matter what method is used to remove the part of the second silicon layer, it is difficult to control the process window, and it is easy to remove the first silicon layer, exposing a silicon substrate and losing a passivation structure on the back side thereof.

SUMMARY

In view of above, it is necessary to provide a solar cell and a preparation method thereof, so as to solve a problem of related process is easy to remove a silicon layer, and exposing a silicon substrate, and losing a passivation structure on the back.

The present disclosure provides a method for preparing a solar cell. The method for preparing the solar cell includes following steps:

forming a tunneling oxide layer on a first side of a silicon substrate;

forming an amorphous silicon layer on the tunneling oxide layer;

performing a diffusion doping treatment on the amorphous silicon layer, the diffusion doping treatment includes: a first process of introducing a doping source and an oxygen source into a diffusion chamber, and heating the amorphous silicon layer, so that a doped polycrystalline silicon layer is formed on the amorphous silicon layer and a doped oxide layer is formed on the doped polycrystalline silicon layer; and a second process of stopping introducing the doping source and maintaining an introduction of the oxygen source to increase a thickness of the doped oxide layer; and forming a heavily doped region on the doped polycrystalline silicon layer by a laser doping process.

In some embodiments, the method complies with at least one of following parameters (1) and (2):
(1) in the first process, a process temperature is in a range of 820° C. to 880° C.; and
(2) in the second process, a process temperature is in a range of 850° C. to 920° C.

In some embodiments, the method complies with at least one of following parameters (1) and (2):
(1) a doping concentration of the doped polycrystalline silicon layer is in a range of $1\times10^{20}$ atoms/cm$^3$ to $3\times10^{21}$ atoms/cm$^3$;
(2) a square resistance of the doped polycrystalline silicon layer is in a range of 25 ohm to 45 ohm.

In some embodiments, in the second process, the thickness of the doped oxide layer is in a range of 80 nm to 120 nm.

In some embodiments, the method complies with at least one of following parameters (1) and (2):
(1) a thickness of the tunneling oxide layer is in a range of 0.5 nm to 2 nm; and
(2) a thickness of the amorphous silicon layer is in a range of 15 nm to 40 nm.

In some embodiments, the method complies with at least one of following parameters (1), (2), (3) and (4):
(1) a wavelength of a light source in the laser doping process is in a range of 350 nm to 700 nm;
(2) a width of a light spot in the laser doping process is in a range of 60 nm to 120 nm;
(3) a doping concentration of the heavily doped region is in a range of $2\times10^{20}$ atoms/cm$^3$ to $2\times10^{21}$ atoms/cm$^3$; and
(4) a square resistance of the heavily doped region is in a range of 10 ohm to 25 ohm.

In some embodiments, after the laser doping process, the method further includes following step:

forming a thermal oxide layer on a back side of the doped oxide layer by a thermal oxidation process.

In some embodiments, the method complies with at least one of following parameters (1), (2) and (3):
(1) a temperature of the thermal oxidation process is in a range of 1000° C. to 1200° C.;
(2) a time of the thermal oxidation process is in a range of 4000 s to 10000 s; and
(3) a thickness of the thermal oxide layer is in a range of 60 nm to 200 nm.

In some embodiments, the method for preparing the solar cell further includes following steps:

forming an emitter region on a second side of the silicon substrate, the second side of the silicon substrate is disposed opposite to the first side of the silicon substrate.

In some embodiments, the method for preparing the solar cell further includes following steps:

preparing a first electrode in contact with the heavily doped region; and/or preparing a second electrode in contact with the emitter region.

The present disclosure further provides a solar cell. The solar cell is prepared by the method of any one of the above embodiments.

Details of one or more embodiments of this application are presented in the attached drawings and descriptions below. And other features, purposes and advantages of this application will become apparent from the description, drawings and claims.

BRIEF DESCRIPTION OF THE DRAWINGS

In order to explain the technical scheme in the embodiment of the application or related technology more clearly, the drawings needed in the description of the embodiment or related technology will be briefly introduced below. Obviously, the drawings in the following description are only the embodiment of the application. For ordinary people in the field, other drawings can be obtained according to the published drawings without creative labor.

REFERENCE SIGNS

100 represents a solar cell, 110 represents a silicon substrate; 120 represents a tunneling oxide layer; 130 represents a doped polycrystalline silicon layer; 131 represents a doped oxide layer; 140 represents a heavily doped region; 150 represents an emitter region; 160 represents a first passivation layer; 161 represents an aluminum oxide layer; 162 represents a first silicon nitride layer; 170 represents a thermal oxide layer; 180 represents a second passivation layer; 191 represents a first electrode; and 192 represents a second electrode.

DETAILED DESCRIPTION OF THE EMBODIMENT

In order to make the above objects, features and advantages of this application more obvious and easy to understand, the specific embodiments of this application will be described in detail with the attached drawings. In the following description, numerous specific details are set forth in order to provide a thorough understanding of the present application. However, this application can be implemented in many other ways different from those described here, and those skilled in the art can make similar improvements without violating the connotation of this application, so this embodiment is not limited by the specific embodiments disclosed below.

Unless otherwise defined, all technical and scientific terms used herein have the same meaning as commonly understood by those skilled in the technical field of this application. The terminology used herein in the specification of this application is only for the purpose of describing specific embodiments, and is not intended to limit this application. As used herein, the term "and/or" includes any and all combinations of one or more related listed items.

In the description of this embodiment, it should be understood that, The terms center, vertical, horizontal, length, width, thickness, top, bottom, front, back, left, right, vertical, horizontal, top and bottom. It is only for the convenience of describing the application and simplifying the description, and does not indicate or imply that the referred devices or elements must have a specific orientation, be constructed and operated in a specific orientation, so it cannot be understood as a limitation of the application.

In addition, the terms "first" and "second" are only used for descriptive purposes, and cannot be understood as indicating or implying relative importance or implicitly indicating the number of indicated technical features. Therefore, the features defined as "first" and "second" can explicitly or implicitly include at least one of these features. In the description of this application, "a plurality of" means at least two, such as two, three, etc., unless otherwise specifically defined.

In this embodiment, unless otherwise specified and limited, the terms "installation", "connection", "be connected to" and "fixation" should be broadly understood, for example, they can be fixed, detachable or integrated. It can be a mechanical connection or an electrical connection. It can be directly connected or indirectly connected through an intermediary, and it can be the internal connection of two elements or the interaction between two elements, unless otherwise specified. For those skilled in the art, the specific meanings of the above terms in this application can be understood according to the specific circumstances.

Figure 1:
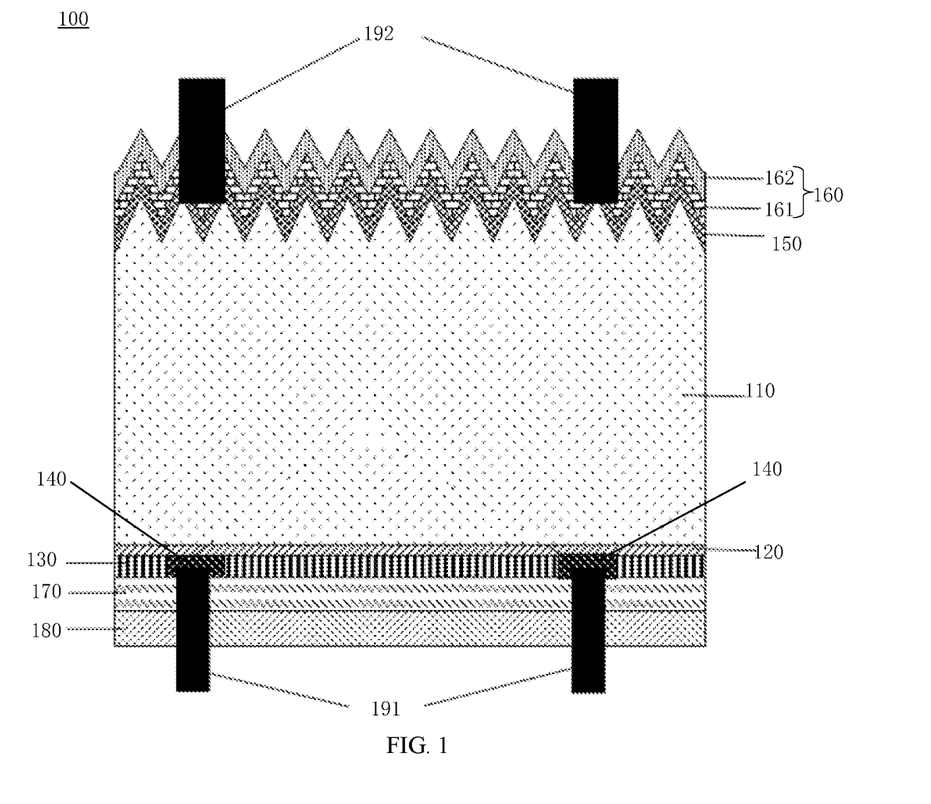
FIG. 1 is a schematic view of a solar cell prepared by a preparation method in an embodiment.
Figure 2:
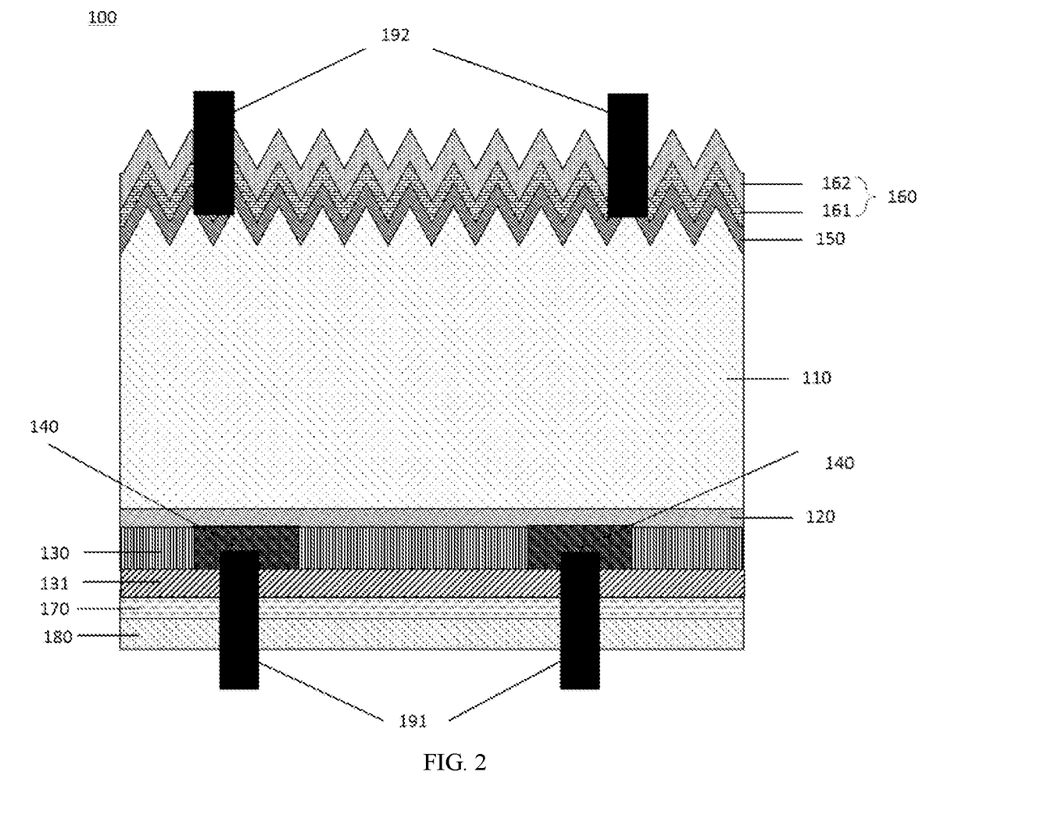
FIG. 2 is a schematic view of a solar cell prepared by a preparation method in an embodiment.

The present disclosure provides a method for preparing a solar cell 100. FIGS. 1 and 2 show a solar cell prepared by a preparation method in an embodiment.

The method for preparing a solar cell includes following steps:

forming a tunneling oxide layer 120 on a first side of a silicon substrate 110;

forming an amorphous silicon layer on the tunneling oxide layer 120;

performing a diffusion doping treatment on the amorphous silicon layer, wherein the diffusion doping treatment includes: a first process of introducing a doping source and an oxygen source into a diffusion chamber, and heating the amorphous silicon layer, so that a doped polycrystalline silicon layer 130 is formed on the amorphous silicon layer and a doped oxide layer 131 is formed on the doped polycrystalline silicon layer 130; and a second process of stopping introducing the doping source and maintaining an introduction of the oxygen source to increase a thickness of the doped oxide layer 131; and forming a heavily doped region 140 on the doped polycrystalline silicon layer 130 by a laser doping process.

According to the method for preparing the solar cell 100, the amorphous silicon layer is formed on the tunneling oxide layer 120 located on the back side of the silicon substrate. The doped polycrystalline silicon layer 130 is formed in a first process by the difference doping treatment. The doped oxide layer 131 is formed on the doped polycrystalline silicon layer 130 in a second process. After the doped oxide layer 131 is formed, the laser doping process is used to realize a selective doping on the back side of the silicon substrate, and a selectively emitter region is formed by the heavily doped region 140. On the one hand, the doped oxide layer 131 can provide enough hetero-ion for SE doping, and on the other hand, the doped oxide layer 131 can protect the tunneling oxide layer 120, reducing or avoiding the damage of the tunneling oxide layer 120 during laser SE doping, so that it can play a great passivation effect.

In addition, the protective effect of the doped oxide layer 131 is beneficial to reduce the thickness of the doped polycrystalline silicon layer 130, and reducing the thickness of the doped polycrystalline silicon layer 130 can greatly reduce the parasitic absorption in a long wave band, thereby improving a short-circuit current of the solar cell 100.

In an embodiment, the method for preparing the solar cell further includes a step of forming an emitter region 150 on a second side of the silicon substrate 110. And the second side of the silicon substrate 110 is disposed opposite to the first side of the silicon substrate 110.

The emitter region 150 can be formed by doping hetero-ion on the second side of the silicon substrate 110, so that a P-N junction is formed between the emitter region 150 and the silicon substrate 110. For example, the silicon substrate 110 is N-type silicon, and the emitter region 150 can be a P+ doped layer formed by a boron diffusion process.

In an embodiment, before the emitter region 150 is formed, the silicon substrate 110 is subjected to a velvet cleaning, and a textured structure is formed on the second side of the silicon substrate 110, which can play a role in reducing reflection.

In an embodiment, the method for preparing the solar cell further includes a step of forming a first passivation layer 160 on the emitter region 150. In an embodiment, the first passivation layer 160 includes an aluminum oxide layer 161 and a first silicon nitride layer 162. The aluminum oxide layer 161 is located between the emitter region 150 and the first silicon nitride layer 162.

Considering that high concentration doping in the amorphous silicon layer on the back side of the solar cell 100 will cause large parasitic absorption, therefore, it is necessary to reduce a thickness of the doped polycrystalline silicon layer 130, but at the same time, a sintering window of a slurry should be taken into account to prevent the sintering window of the slurry from being burned through. Therefore, a deposition process, a diffusion process and laser parameters are the keys of the back SE technology of the solar cell 100.

In an embodiment, the tunneling oxide layer 120 is deposited by a CVD process. In an embodiment, the tunneling oxide layer 120 is deposited by a LPCVD (low pressure chemical vapor deposition) process. It can be understood that $O_2$ can be used as a precursor of the tunneling oxide layer 120.

In an embodiment, the deposition process parameters of the tunneling oxide layer 120 includes: a pressure being in a range of 740 torr to 780 torr, wherein the pressure can be in a range of 755 torr to 765 torr, and furthermore, the pressure can be 760 torr; a temperature being in a range of 550° C. to 650° C., wherein the temperature can be in a range of 590° C. to 610° C. and furthermore, the temperature can be 600° C.; a flow of an oxygen source being in a range of 20000 sccm to 40000 sccm, wherein the flow of the oxygen source can be in the range of 25000 sccm to 35000 sccm and furthermore, the flow of the oxygen source can be 30000 sccm; and a time being in a range of 500 s to 1500 s wherein the time can be in range of 900 s to 1100s and furthermore, the time can be 1000 s.

In an embodiment, a thickness of the tunneling oxide layer is in a range of 0.5 nm to 2 nm. In another embodiment, the thickness of the tunneling oxide layer 120 can be 1.5 nm.

In an embodiment, the tunneling oxide layer 120 is deposited by the CVD process. In another embodiment, the tunneling oxide layer 120 is deposited by the LPCVD process. It can be understood that $SiH_4$ can be used as a precursor of the tunneling oxide layer 120.

In an embodiment, the deposition process parameters of the amorphous silicon layer includes: a pressure being in a range of 0.2 torr to 0.4 torr, wherein the pressure can be 0.3 torr; a temperature being in a range of 550° C. to 650° C., wherein the temperature can be in the range of 590° C. to 610° C., and furthermore the temperature can be 600° C.; a flow of $SiH_4$ being in a range of 500 sccm to 2000 sccm, wherein the flow of $SiH_4$ can be in a range of 1300 sccm to 1500 sccm, and furthermore, the flow of the oxygen source can be 1400 sccm; and a time being in a range of 150 s to 400 s, wherein the time can be in a range of 180 s to 220 s, and furthermore the time can be 200 s.

In an embodiment, a thickness of the amorphous silicon layer is more than 15 nm, such as 15 nm to 40 nm. It shows that the amorphous silicon layer with a thickness of about 15 nm can meet the passivation requirements of the cell, and increasing the thickness of the amorphous silicon layer can avoid burning through in a metallization process. In an embodiment, the thickness of the amorphous silicon layer can be in the range of 15 nm to 20 nm. In another embodiment, the thickness of the amorphous silicon layer can be 20 nm. In this embodiment, by setting the thickness of the amorphous silicon layer in the range of 15 nm to 40 nm, it can greatly reduce the parasitic absorption in a long wave band, improving a short-circuit current of the solar cell 100.

In the first process of the diffusion doping treatment, the doping source and the oxygen source are introduced for deposition and thermal diffusion to dope the amorphous silicon layer and form the doped polycrystalline silicon layer 130.

In an embodiment, the doping source is a phosphorus source, such as a phosphorus oxychloride, to dope the amorphous silicon layer with phosphorus.

In the first process, the way of introducing the doping source is introducing nitrogen. And the liquid doping source (such as phosphorus oxychloride) in a source bottle is brought into a furnace tube by the nitrogen.

In an embodiment, a process temperature in the first process is in a range of 820° C. to 880° C. In an example, the process temperature in the first process can be in a range of 860° C. to 880° C. In another example, the process temperature in the first process can be 870° C. Compared with the conventional process, this embodiment reduces the diffusion temperature and prevents the doping source from expanding too seriously/severely and avoids damaging/destroying the passivation structure when the amorphous silicon layer is thinned.

In an embodiment, the process parameters of the first process further includes:

a flow rate of nitrogen being in a range of 500 sccm to 1500 sccm, wherein the flow rate of nitrogen can be in a range of 800 sccm to 1200 sccm, and furthermore, the flow rate of nitrogen can be 1000 sccm; a flow rate of an oxygen source can be in a range of 500 sccm to 1500 sccm, wherein the flow rate of the oxygen source can be in a range of 900 sccm to 1100 sccm, and furthermore, the flow rate of the oxygen source can be 1000 sccm; a pressure being in a range of 100 torr to 500 torr, wherein the pressure can be in a range of 150 torr to 250 torr and furthermore, the pressure can be 200 torr; a time being in a range of 400 s to 2000 s, wherein the time can be in a range of 600 s to 1000 s and furthermore, the time can be 800 s.

In the second process of the diffusion doping treatment, the oxygen source is introduced to form the doped oxide layer 131 on the doped polycrystalline silicon layer 130. In the second process, no doping source is introduced, and the main purpose is to form a thick doped oxide layer 131.

As mentioned above, the doped source is the phosphorus source, such as phosphorus oxychloride. And the formed doped oxide layer 131 is a phosphosilicate glass layer (PSG layer).

In an embodiment, process parameters of the second process includes: a temperature being in a range of 850° C. to 920° C., wherein the temperature can be in a range of 865° C. to 875° C., and furthermore the temperature can be 870° C.; a flow rate of an oxygen source being in a range of 1500 sccm to 2500 sccm, wherein the flow rate of the oxygen source can be 2000 sccm; a pressure being in a range of 350 torr to 450 torr, wherein the pressure can be 400 torr; and a time being in a range of 2000 s to 5000 s, wherein the time can be in a range of 2500 s to 3500 s, and furthermore the time can be 3000 s.

In an embodiment, in the second process, a thickness of the doped oxide layer 131 is in a range of 80 nm to 120 nm. In another embodiment, the thickness of the doped oxide layer 131 is in the range of 90 nm to 100 nm. In another embodiment, the thickness of the doped oxide layer 131 is 100 nm. On the one hand, the doped oxide layer 131 with the thick thickness can provide enough hetero-ion for laser doping to form a SE cell piece; on the other hand, the doped oxide layer 131 with the thick thickness can protect the tunneling oxide layer 120 from being damaged during laser doping, so that it can play a great passivation effect.

In an embodiment, a doping concentration of the doped polycrystalline silicon layer 130 is in a range of $1\times10^{20}$ atoms/cm$^3$ to $3\times10^{21}$ atoms/cm$^3$. In another embodiment, the doping concentration of the doped polycrystalline silicon layer 130 is in the range of $1.5\times10^{21}$ atoms/cm$^3$ to $2.5\times10^{21}$ atoms/cm$^3$. In another embodiment, the doping concentration of the doped polycrystalline silicon layer 130 is $2\times10^{21}$ atoms/cm$^3$.

In an embodiment, a square resistance of the doped polycrystalline silicon layer 130 is in a range of 25 ohm to 45 ohm. In another embodiment, the square resistance of the doped polycrystalline silicon layer 130 is in a range of 32 ohm to 38 ohm. In another embodiment, the square resistance of the doped polycrystalline silicon layer 130 is 35 ohm.

After the doped oxide layer 131 is formed, selective heavy doping on the back side of the silicon substrate is realized by laser, and the selective emitter region is formed by the heavily doped region 140.

In an embodiment, a wavelength of a light source in the laser doping process is in a range of 350 nm to 700 nm. In another embodiment, the wavelength of the light source in the laser doping process is 532 nm (green light). And in another embodiment, the wavelength of the light source in the laser doping process is 355 nm (purple light).

In an embodiment, a width of a light spot in the laser doping process is in a range of 60 nm to 120 nm. In another embodiment, the width of the light spot in the laser doping process is 80 nm.

In an embodiment, a doping concentration of the heavily doped region 140 is in a range of $2\times10^{20}$ atoms/cm$^3$ to $2\times10^{21}$ atoms/cm$^3$. In another embodiment, the doping concentration of the heavily doped region 140 is in a range of $6\times10^{20}$ atoms/cm$^3$ to $1\times10^{21}$ atoms/cm$^3$. In another embodiment, the doping concentration of the heavily doped region 140 is $8\times10^{20}$ atoms/cm$^3$.

In an embodiment, a square resistance of the heavily doped region 140 is in a range of 10 ohm to 25 ohm. In another embodiment, the square resistance of the heavily doped region 140 is in a range of 13 ohm to 17 ohm. In another embodiment, the square resistance of the heavily doped region 140 is 15 ohm.

In an embodiment, after the laser doping process, the method further includes: forming a thermal oxide layer 170 on a back side of the doped oxide layer 131 by a thermal oxidation process.

In the above embodiment, a layer of the thermal oxide layer 170 is formed by thermal oxidation on the back surface SE. On the one hand, the thermal oxide layer 170 can be used as a barrier layer of metal slurry to prevent the doped polycrystalline silicon layer 130 from being burned through. On the other hand, the thermal oxide layer 170 grown by a thermal oxygen method is also an excellent passivation material, which can have an auxiliary passivation effect.

In an embodiment, the process parameters of the thermal oxidation process includes: a temperature of the thermal oxidation process being in a range of 1000° n a range of, and a time of the thermal oxidation process being in a range of 4000 s to 10000 s.

The thermal oxide layer 170 has a certain thickness to ensure that the doped polycrystalline silicon layer 130 is not burnt through. In an embodiment, a thickness of the thermal oxide layer 170 is in a range of 60 nm to 200 nm. In an embodiment, a thickness of the thermal oxide layer 170 is in a range of 70 nm to 100 nm. And in another embodiment, the thickness of the thermal oxide layer 170 is 80 nm.

In an embodiment, the doped oxide layer 131 and the doped polycrystalline silicon layer 130 located on the second side and a side surface of the silicon substrate 110 are removed by an etching cleaning process. The etching cleaning process can be performed after the laser doping process or the thermal oxidation process.

In an embodiment, the second passivation layer 180 is deposited on the back side of the thermal oxide layer 170. In an embodiment, the second passivation layer 180 includes a second silicon nitride layer. The step of depositing the second passivation layer 180 can be after the laser doping process, or after the thermal oxidation process, or after the etching cleaning process.

As mentioned above, the solar cell 100 can be configured as a TOPCon cell, but is not limited to being configured as a TOPCon cell.

In the preparation method of the solar cell 100 described above, the amorphous silicon layer is formed on the tunneling oxide layer 120 on the back side. The doped polycrystalline silicon layer 130 is formed in the first process by the difference doping treatment, and the doped oxide layer 131 is formed on the doped polycrystalline silicon layer 130 in the second process. After the doped oxide layer 131 is formed, the laser doping process is used to realize selective doping on the back side, and the selective emitter region is formed by the heavily doped region 140. On the one hand, the doped oxide layer 131 can provide enough hetero-ion for laser doping, and on the other hand, the doped oxide layer 131 can protect the tunneling oxide layer 120, thereby reducing or preventing the tunneling oxide layer 120 from being damaged during laser doping, so that the tunneling oxide layer 120 can have a good passivation effect.

In addition, the protective effect of the doped oxide layer 131 is beneficial to reduce the thickness of the doped polycrystalline silicon layer 130, which can greatly reduce the parasitic absorption in long wave band and improve a short-circuit current of the solar cell 100.

In an embodiment, the method for preparing the solar cell future includes following steps:

preparing a first electrode in contact with the heavily doped region 140; and/or, preparing a second electrode in contact with the emitter region 150.

The present disclosure has simple steps and easily controlled process, and the preparation process does not involve complicated MASK or patterning steps, which comply with the requirements of mass production, and improves the efficiency and greatly reduces the production cost.

Furthermore, the present invention further provides a solar cell. The solar cell is prepared by the above method.

The following embodiments are provided to further illustrate this invention.

Embodiment 1

This embodiment provides a method for preparing a solar cell, which includes the following steps:
- S1, velvet cleaning: providing an N-type silicon wafer, and forming a pyramid suede on a front side of the N-type silicon wafer by an alkali washing process;
- S2, boron diffusion: performing a boron diffusion process on the front surface of the N-type silicon wafer to prepare an emitter region and forming a P-N junction;
- S3, back etching: cleaning the P-N junction winding plating on a back side of the N-type silicon wafer, and polishing the back side of the N-type silicon wafer;
- S4, LPCVD: sequentially depositing a tunneling silicon oxide layer and an amorphous silicon layer by LPCVD,
  - wherein when depositing the tunneling silicon oxide layer, the process parameters includes: a pressure being 760 torr, a temperature being 600° C., an oxygen flow rate being 30000 sccm, and a time being 1000 s;
  - a thickness of the tunneling oxide layer formed is 1.5 nm;
  - when depositing the amorphous silicon layer, the process parameters includes: a pressure being 0.3 torr, a temperature being 600° C., a flow rate of $SiH_4$ being 1400 sccm, and a time being 200 s; and
  - the thickness of the amorphous silicon layer formed is 20 nm;
- S5, phosphorus diffusion: performing phosphorus diffusion process on the back side of the N-type silicon wafer to form the N-type doped polycrystalline silicon layer (n-poly),
  - wherein the phosphorus diffusion mainly includes a first process and a second process;
- in the first process, phosphorus source and oxygen are introduced for deposition, and phosphorus doping is promoted at high temperature; among them, the introduction of phosphorus source means that a liquid phosphorus oxychloride in the source bottle is brought into a furnace tube by nitrogen;
  - the process parameters of the first process includes: a deposition temperature being 860° C., a nitrogen flow rate being 1000 sccm, an oxygen flow rate being 1000 sccm, a pressure being 200 torr, and a time being 800 s;
- in the second process, the main purpose of introducing oxygen without introducing phosphorus source is to form a thicker PSG layer;
  - the process parameters of the second process includes: a deposition temperature being 870° C., an oxygen flow rate being 2000 sccm, a pressure being 400 torr, and a time being 3000 s;
  - the PSG layer formed in this phosphorus diffusion step has a thickness of 100 nm, a doping concentration is $2 \times 10^{20}$ atoms/cm$^3$, a square resistance is 35 ohm;
- S6, back laser SE: using laser to re-dope at the back gate line to form the selective emitter region 150,
  - wherein the process in step S6 uses green laser with a 532 nm, an adopted spot is a square spot with a width of 80 nm, a doping concentration of the heavily doped region 140 is $8 \times 10^{20}$ atoms/cm$^3$, and a square resistance of the heavily doped region is 15 ohm;
- S7, thermal oxidation: using tubular thermal oxidation furnace tube to grow a thermal oxide layer on the back of the N-type silicon wafer;
  - wherein the process parameters in step S7 includes: a temperature being 1100° C. and a time being 8000 s, and
  - a thickness of the thermal oxide layer is 80 nm;
- S8, etching cleaning: using a chain polishing method and a groove polis method to clean and remove the PSG layer and the amorphous silicon layer located on the front side and the side surface;
- S9, film plating: an alumina layer and a first silicon nitride layer are sequentially deposited on the front side of the N-type silicon wafer, and the second silicon nitride layer is deposited on the back side; and
- S10, metallization: printing silver-aluminum paste on the front side of the N-type silicon wafer, printing silver paste on the back side of the N-type silicon wafer, and sintering at high temperature for metallization to obtain gate lines.

Embodiment 2

This embodiment provides a method for preparing a solar cell, which includes the following steps:
- S1, velvet cleaning: providing a monocrystalline silicon wafer, and forming a pyramid suede on a front side of the monocrystalline silicon wafer by an alkali washing process;
- S2, boron diffusion: performing a boron diffusion process on the front surface of the monocrystalline silicon wafer to prepare an emitter region and forming a P-N junction;
- S3, back etching: cleaning the PN junction winding plating on a back side of the monocrystalline silicon wafer, and polishing the back side of the monocrystalline silicon wafer;
- S4, LPCVD: sequentially depositing a tunneling silicon oxide layer and an amorphous silicon layer by LPCVD,
  - wherein depositing the tunneling silicon oxide layer, the process parameters includes: a pressure being 760 torr, a temperature being 600° C., an oxygen flow rate being 30000 sccm, and a time being 1000 s;
  - a thickness of the tunneling oxide layer formed is 1.5 nm;
  - when depositing the amorphous silicon layer, the process parameters includes: a pressure being 0.3 torr, a temperature being 600° C., a flow rate of $SiH_4$ being 1400 sccm, and a time being 200 s; and
  - the thickness of the amorphous silicon layer formed is 20 nm;
- S5, phosphorus diffusion: performing phosphorus diffusion process on the back side of the monocrystalline silicon wafer to form an N-type doped polycrystalline silicon layer (n-poly), wherein the phosphorus diffusion mainly includes a first process and a second process;

in the first process, phosphorus source and oxygen are introduced for deposition, and phosphorus doping is promoted at high temperature; among them, the introduction of phosphorus source means that a liquid phosphorus oxychloride in the source bottle is brought into the furnace tube by nitrogen;

the process parameters of the first process includes: a deposition temperature being 860° C., a nitrogen flow rate being 1000 sccm, an oxygen flow rate being 1000 sccm, a pressure being 200 torr, and a time being 800 s;

in the second process, the main purpose of introducing oxygen without introducing phosphorus source is to form a thicker PSG layer;

the process parameters of the second process includes: a deposition temperature being 870° C., an oxygen flow rate being 2000 sccm, a pressure being 400 torr, and a time being 3000 s.;

the PSG layer formed in this phosphorus diffusion step has a thickness of 30 nm, a doping concentration is $2\times10^{20}$ atoms/cm$^3$, a square resistance is 35 ohm;

S6, back laser SE: using laser to re-dope at the back gate line to form the selective emitter region, wherein the process in step S6 uses green laser with a 532 nm, an adopted spot is a square spot with a width of 80 nm, a doping concentration of the heavily doped region 140 is $8\times10^{20}$ atoms/cm$^3$, and a square resistance of the heavily doped region 140 is 15 ohm;

S7, thermal oxidation: using tubular thermal oxidation furnace tube to grow a thermal oxide layer on the back side of the monocrystalline silicon wafer;

wherein the process parameters in step S7 includes: a temperature being 1100° C. and a time being 8000 s, and a thickness of the thermal oxide layer is 80 nm;

S8, etching cleaning: using a chain polishing method and a groove polis method to clean and remove the PSG layer and the amorphous silicon layer on the front side and the side;

S9, film plating: an alumina layer and a first silicon nitride layer are sequentially deposited on the front side of the monocrystalline silicon wafer, and the second silicon nitride layer is deposited on the back side; and S10, metallization: printing silver-aluminum paste on the front side of the monocrystalline silicon wafer, printing silver paste on the back side of the monocrystalline silicon wafer, and sintering at high temperature for metallization to obtain gate lines.

Comparative Embodiment 1

This comparative embodiment provides a method for preparing a solar cell, which includes the following steps:

S1, velvet cleaning: providing a monocrystalline silicon wafer, and forming a pyramid suede on a front side of the monocrystalline silicon wafer by an alkali washing process.

S2, boron diffusion: performing a boron diffusion process on the front surface of the monocrystalline silicon wafer to prepare an emitter region and form a P-N junction;

S3, back etching: cleaning the P-N junction winding plating on a back side of the monocrystalline silicon wafer, and polishing the back side of the monocrystalline silicon wafer;

S4, LPCVD: sequentially depositing a tunneling silicon oxide layer and an amorphous silicon layer by the LPCVD, wherein when depositing the tunneling silicon oxide layer, the process parameters includes: a pressure being 760 torr, a temperature being 600° C., an oxygen flow rate being 30000 sccm, and a time being 1000 s;

a thickness of the tunneling oxide layer formed is 1.5 nm;

when depositing the amorphous silicon layer, the process parameters includes: a pressure being 0.3 torr, a temperature being 600° C., a flow rate of SiH$_4$ being 1400 sccm, and a time being 200 s; and a thickness of the amorphous silicon layer formed is 120 nm;

S5, phosphorus diffusion: performing phosphorus diffusion process on the back side of the monocrystalline silicon wafer to form an N-type doped polycrystalline silicon layer (n-poly), wherein the phosphorus diffusion mainly includes a first process and a second process;

in the first process, phosphorus source and oxygen are introduced for deposition, and phosphorus doping is promoted at high temperature; among them, the introduction of phosphorus source means that a liquid phosphorus oxychloride in the source bottle is brought into a furnace tube by nitrogen;

the process parameters of the first process includes: a deposition temperature being 860° C., a nitrogen flow rate being 1000 sccm, an oxygen flow rate being 1000 sccm, a pressure being 200 torr, and a time being 800 s;

in the second process, introducing oxygen without introducing phosphorus source; the process parameters of the second process includes: a deposition temperature being 870° C., an oxygen flow rate being 2000 sccm, a pressure being 400 torr, and a time being 3000 s; and the PSG layer formed in this phosphorus diffusion step has a thickness of 30 nm, a doping concentration is $2\times10^{20}$ atoms/cm$^3$, a square resistance is 35 ohm;

S6, etching cleaning: using a chain polishing method and a groove polis method to clean and remove the PSG layer and the amorphous silicon layer located on the front side and the side surface;

S7, film plating: an alumina layer and a first silicon nitride layer are sequentially deposited on the front side of the monocrystalline silicon wafer, and the second silicon nitride layer is deposited on the back side; and S8, metallization: printing silver-aluminum paste on the front side of the monocrystalline silicon wafer, printing silver paste on the back side of the monocrystalline silicon wafer, and sintering at high temperature for metallization to obtain gate lines.

Comparative Embodiment 2

This comparative embodiment provides a method for preparing a solar cell, which includes the following steps:

S1, velvet cleaning: providing a monocrystalline silicon wafer, and forming a pyramid suede on the front of the monocrystalline silicon wafer by an alkali washing process;

S2, boron diffusion: performing a boron diffusion process on a front side of the monocrystalline silicon wafer to prepare an emitter region and form a P-N junction;

S3, back etching: cleaning the P-N junction winding plating on a back side of the monocrystalline silicon wafer, and polishing the back side of the monocrystalline silicon wafer;

S4, LPCVD: sequentially depositing a tunneling silicon oxide layer and an amorphous silicon layer by the LPCVD, wherein when depositing the tunneling silicon oxide layer, the process parameters includes: a pressure being 760 torr, a temperature being 600° C., an oxygen flow rate being 30000 sccm, and a time being 1000 s;

the thickness of the tunneling oxide layer formed is 1.5 nm;

when depositing the amorphous silicon layer, the process parameters includes: a pressure being 0.3 torr, a temperature being 600° C., a flow rate of $SiH_4$ being 1400 sccm, and a time being 200 s;

a thickness of the amorphous silicon layer formed is 20 nm;

S5, phosphorus diffusion: performing phosphorus diffusion process on the back side of the monocrystalline silicon wafer to form an N-type doped polycrystalline silicon layer (n-poly), wherein the phosphorus diffusion mainly includes a first process and a second process;

in the first process, phosphorus source and oxygen are introduced for deposition, and phosphorus doping is promoted at high temperature; among them, the introduction of phosphorus source means that a liquid phosphorus oxychloride in the source bottle is brought into a furnace tube by nitrogen;

the process parameters of the first process includes: a deposition temperature being 860° C., a nitrogen flow rate being 1000 sccm, an oxygen flow rate being 1000 sccm, a pressure being 200 torr, and a time being 800 s;

in the second process, introducing oxygen without introducing phosphorus source;

the process parameters of the second process includes: a deposition temperature being 870° C., an oxygen flow rate being 2000 sccm, a pressure being 400 torr, and a time being 3000 s; and the PSG layer formed in this phosphorus diffusion step has a thickness of 30 nm, a doping concentration is $2 \times 10^{20}$ atoms/cm$^3$, a square resistance is 35 ohm;

S6, etching cleaning: using a chain polishing method and a groove polis method to clean and remove the PSG layer and the amorphous silicon layer located on the front side and the side surface;

S7, film plating: an alumina layer and a first silicon nitride layer are sequentially deposited on the front side of the monocrystalline silicon wafer, and the second silicon nitride layer is deposited on the back side; and S8, metallization: printing silver-aluminum paste on the front side of the monocrystalline silicon wafer, printing silver paste on the back side of the monocrystalline silicon wafer, and sintering at high temperature for metallization to obtain gate lines.

Comparative Embodiment 3

This comparative embodiment provides a method for preparing a solar cell, which includes the following steps:

S1, velvet cleaning: providing a monocrystalline silicon wafer, and forming a pyramid suede on a front side of the monocrystalline silicon wafer by an alkali washing process;

S2, boron diffusion: performing a boron diffusion process on the front side of the monocrystalline silicon wafer to prepare an emitter region and form a P-N junction;

S3, back etching: cleaning the PN junction winding plating on the back side of the monocrystalline silicon wafer, and polishing the back of the monocrystalline silicon wafer;

S4, LPCVD: sequentially depositing a tunneling silicon oxide layer and an amorphous silicon layer by the LPCVD, wherein when depositing the tunneling silicon oxide layer, the process parameters includes: a pressure being 760 torr, a temperature being 600° C., an oxygen flow rate being 30000 sccm, and a time being 1000 s;

a thickness of the tunneling oxide layer 120 formed is 1.5 nm;

when depositing the amorphous silicon layer, the process parameters includes: a pressure being 0.3 torr, a temperature being 600° C., a flow rate of $SiH_4$ being 1400 sccm, and a time being 200 s; and a thickness of the amorphous silicon layer formed is 20 nm;

S5, phosphorus diffusion: performing phosphorus diffusion process on the back side of the monocrystalline silicon wafer to form an N-type doped polycrystalline silicon layer (n-poly), wherein the phosphorus diffusion mainly includes a first process and a second process;

in the first process, phosphorus source and oxygen are introduced for deposition, and phosphorus doping is promoted at high temperature; among them, the introduction of phosphorus source means that a liquid phosphorus oxychloride in the source bottle is brought into a furnace tube by nitrogen;

the process parameters of the first process includes: a deposition temperature being 860° C., a nitrogen flow rate being 1000 sccm, an oxygen flow rate being 1000 sccm, a pressure being 200 torr, and a time being 800 s;

in the second process, introducing oxygen without introducing phosphorus source; the process parameters of the second process includes: a deposition temperature being 870° C., an oxygen flow rate being 2000 sccm, a pressure being 400 torr, and a time being 3000 s;

the PSG layer formed in this phosphorus diffusion step has a thickness of 30 nm, a doping concentration is $2 \times 10^{20}$ atoms/cm$^3$, a square resistance is 35 ohm;

S6: thermal oxidation: using tubular thermal oxidation furnace tube to grow a thermal oxide layer on the back of the monocrystalline silicon wafer;

the process parameters in step S7 includes: a temperature is 1100° C. and a time is 8000 s; and a thickness of the thermal oxide layer is 80 nm.

S7, etching cleaning: using a chain polishing method and a groove polis method to clean and remove the PSG layer and the amorphous silicon layer located on the front side and the side surface;

S8, film plating: an alumina layer and a first silicon nitride layer are sequentially deposited on the front side of the monocrystalline silicon wafer, and the second silicon nitride layer is deposited on the back side; and S9, metallization: printing silver-aluminum paste on a front of the monocrystalline silicon wafer, printing silver paste on the back side of the monocrystalline silicon wafer, and sintering at high temperature for metallization to obtain gate lines.

The differences between the above embodiments 1 and 2 and comparative embodiments 1 to 3 are shown in Table 1.

TABLE 1

Differences between embodiments 1 and 2 and comparative embodiments 1 to 3

| | The thickness of the doped polycrystalline silicon layer (nm) | The thickness of the PSG layer (nm) | Whether the laser doping process is carried out | Whether a thermal oxide layer is formed on the doped polycrystalline silicon layer |
|---|---|---|---|---|
| Embodiment 1 | 20 | 100 | yes | yes |
| Embodiment 2 | 20 | 30 | yes | yes |
| Comparative embodiment 1 | 120 | 30 | no | no |
| Comparative embodiment 2 | 20 | 30 | no | no |
| Comparative embodiment 3 | 20 | 30 | no | yes |

The solar cell 100 prepared in embodiments 1 and 2 and comparative embodiments 1 to 3 were tested for electrical properties, and the results are shown in Table 2. The test method is carried out according to IEC TS 63202-3 Photovoltaic Cells-Part 3: Measurement of Current-Voltage Characteristics of Bici Photovoltaic Cells formulated and issued by the International Electrotechnical Commission.

TABLE 2 electrical properties of the solar cell 100 prepared in embodiments 1 and 2 and comparative embodiments 1 to 3.

| | Open-circuit voltage Uoc (V) | Short-circuit current Isc (A) | Fill factor FF (%) | Cell conversion efficiency Eta (%) |
|---|---|---|---|---|
| Embodiment 1 | 0.725 | 11.630 | 82.00 | 25.22 |
| Embodiment 2 | 0.723 | 11.628 | 81.88 | 25.11 |
| Comparative embodiment 1 | 0.710 | 11.559 | 81.89 | 24.51 |
| Comparative embodiment 2 | 0.705 | 11.609 | 81.71 | 24.39 |
| Comparative embodiment 3 | 0.716 | 11.624 | 81.79 | 24.83 |

It can be seen from the test results in Table 2 that the thickness of doped polycrystalline silicon layer in comparative embodiment 1 is greater than that in comparative embodiment 2, so the parasitic absorption is more serious, resulting in a lower short-circuit current in comparative embodiment 1. Although a thin doped polycrystalline silicon layer is formed in comparative embodiment 2, however, the open-circuit voltage in comparative embodiment 2 is seriously lower than that in comparative embodiment 1. The reason for the decrease of the open-circuit voltage in comparative embodiment 2 is that the thickness reduction of doped polycrystalline silicon layer will make the current gain larger, but it will also cause the silver paste layer on the back side to be easily burned through, which will make the doped polycrystalline silicon layer directly be in contact with the silicon substrate and recombine in large quantities, thus reducing the open-circuit voltage.

Compared with comparative embodiment 2, the thicker thermal oxide layer of comparative embodiment 3 is grown on the doped polysilicon layer. The thermal oxide layer can play a good role in blocking and passivation, so it can obtain high current gain and maintain high the open-circuit voltage at the same time.

In both embodiment 1 and embodiment 2, a PSG layer is formed on the doped polycrystalline silicon layer, and the laser doping process is performed. From the results of electrical performance, the open-circuit voltage in embodiment 1 and embodiment 2 is obviously higher than that in comparative embodiment 1 to 3, which is at least 7 mV higher. Compared with embodiment 1, although the PSG layer formed in embodiment 2 has a certain protective effect on the doped polysilicon layer, the laser still damages the tunneling oxide layer during the laser doping process due to its thin thickness, which makes the open-circuit voltage in embodiment 2 relatively low.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present disclosure.

The above-described embodiments are merely illustrative of several embodiments of the present disclosure, and the description thereof is relatively specific and detailed, but is not to be construed as limiting the scope of the disclosure. It should be noted that a number of variations and modifications may be made by those skilled in the art without departing from the spirit and scope of the disclosure, and these variations and modifications belong to the scope of the claimed disclosure. Therefore, the scope of the disclosure should be determined by the appended claims.

What is claimed is:

1. A method for preparing a solar cell, comprising following steps:
    forming a tunneling oxide layer on a first side of a silicon substrate;
    forming an emitter region on a second side of the silicon substrate, wherein the second side of the silicon substrate is disposed opposite to the first side of the silicon substrate;
    forming an amorphous silicon layer on the tunneling oxide layer;
    performing a diffusion doping treatment on the amorphous silicon layer, wherein the diffusion doping treatment comprises: a first process of introducing a doping source and an oxygen source into a diffusion chamber, and heating the amorphous silicon layer, so that a doped polycrystalline silicon layer is formed on the amorphous silicon layer and a doped oxide layer is formed on the doped polycrystalline silicon layer; and a second process of stopping introducing the doping source and maintaining an introduction of the oxygen source to increase a thickness of the doped oxide layer; and forming a heavily doped region in the doped polycrystalline layer by a laser doping process.

2. The method for preparing the solar cell of claim 1, wherein the method complies with at least one of following parameters (1) and (2):

(1) in the first process, a process temperature is in a range of 820° C. to 880° C.; and (2) in the second process, a process temperature is in a range of 850° C. to 920° C.

3. The method for preparing the solar cell of claim 1, wherein in the second process, the thickness of the doped oxide layer is in a range of 80 nm to 120 nm.

4. The method for preparing the solar cell of claim 1, wherein the method complies with at least one of following parameters (1) and (2):

(1) a thickness of the tunneling oxide layer is in a range of 0.5 nm to 2 nm; and (2) a thickness of the amorphous silicon layer is in a range of 15 nm to 40 nm.

5. The method for preparing the solar cell of claim 1, wherein the method complies with at least one of following parameters (1), (2), (3) and (4):

(1) a wavelength of a light source in the laser doping process is in a range of 350 nm to 700 nm;

(2) a width of a light spot in the laser doping process is in a range of 60 nm to 120 nm;

(3) a doping concentration of the heavily doped region is in a range of $2\times10^{20}$ atoms/cm$^3$ to $2\times10^{21}$ atoms/cm$^3$; and (4) a square resistance of the heavily doped region is in a range of 10 ohm to 25 ohm.

6. The method for preparing the solar cell of claim 1, wherein after the laser doping process, the method further comprises following step of forming a thermal oxide layer on a back side of the doped oxide layer by a thermal oxidation process.

7. The method for preparing the solar cell of claim 6, wherein the method complies with at least one of following parameters (1), (2) and (3):

(1) a temperature of the thermal oxidation process is in a range of 1000° C. to 1200° C.;

(2) a time of the thermal oxidation process is in a range of 4000 s to 10000 s; and (3) a thickness of the thermal oxide layer is in a range of 60 nm to 200 nm.

8. The method for preparing the solar cell of claim 1, further comprising following steps:

preparing a first electrode in contact with the heavily doped region; and/or preparing a second electrode in contact with the emitter region.

* * * * *